US006616394B1

(12) United States Patent
Park (10) Patent No.: US 6,616,394 B1
(45) Date of Patent: *Sep. 9, 2003

(54) APPARATUS FOR PROCESSING WAFERS (75) Inventor: Jae Heon Park, Cupertino, CA (US)

(73) Assignee: Silicon Valley Group, San Jose ( * ) Notice: Subject to any disclaimer, the term of this patent is extended or adjusted under 35 U.S.C. 154(b) by 0 days.

This patent is subject to a terminal disclaimer.

(21) Appl. No.: 09/223,111

(22) Filed: Dec. 30, 1998

(51) Int. Cl.⁷ ................................................. B65H 5/00
(52) U.S. Cl. ................... 414/222.01; 414/217; 414/937
(58) Field of Search ........................ 414/222.01, 222.07, 414/222.13, 226.01, 226.03, 226.05, 217, 937

(56) References Cited

U.S. PATENT DOCUMENTS

| | | | | |
|---|---|---|---|---|
| 3,302,804 A | * | 2/1967 | Harris ......................... 414/283 |
| 4,917,556 A | * | 4/1990 | Stark et al. .................. 414/217 |
| 4,985,722 A | | 1/1991 | Ushijima et al. ............ 354/319 |
| 5,061,144 A | | 10/1991 | Akimoto et al. ............ 414/225 |
| 5,177,514 A | | 1/1993 | Ushijima et al. ............ 354/319 |
| 5,202,716 A | * | 4/1993 | Tateyama et al. ....... 414/217 X |
| 5,407,449 A | | 4/1995 | Zinger ......................... 29/25.01 |
| 5,442,416 A | | 8/1995 | Tateyama et al. ........... 354/319 |
| 5,626,675 A | | 5/1997 | Sakamoto et al. .......... 118/663 |
| 5,651,823 A | | 7/1997 | Parado et al. ............... 118/500 |
| 5,664,254 A | | 9/1997 | Ohkura et al. .............. 396/612 |
| 5,701,627 A | | 12/1997 | Matsumura et al. ......... 15/88.2 |
| 5,762,745 A | | 6/1998 | Hirose ......................... 156/345 |
| 5,766,824 A | | 6/1998 | Batchelder .................. 430/330 |
| 5,788,868 A | | 8/1998 | Itaba et al. ................... 216/41 |
| 5,803,932 A | | 9/1998 | Akimoto et al. ........... 29/25.01 |
| 5,826,129 A | | 10/1998 | Hasebe et al. ............... 396/611 |
| 5,844,662 A | | 12/1998 | Akimoto et al. ............... 355/27 |
| 5,923,915 A | | 7/1999 | Akimoto et al. ............ 396/604 |
| 5,928,389 A | | 7/1999 | Jevtic ......................... 29/25.01 |
| 5,928,390 A | | 7/1999 | Yeagashi et al. ........... 29/25.01 |
| 5,937,223 A | | 8/1999 | Akimoto et al. ............ 396/604 |
| 5,963,753 A | | 10/1999 | Ohtani et al. ............... 396/611 |
| 5,968,691 A | | 10/1999 | Yoshioka et al. ............. 430/30 |
| 5,972,110 A | * | 10/1999 | Akimoto ............ 414/222.13 X |
| 6,013,112 A | | 1/2000 | Iizuka et al. ............... 29/25.01 |
| 6,024,502 A | | 2/2000 | Akimoto et al. ............ 396/579 |
| 6,027,262 A | | 2/2000 | Akimoto ..................... 396/611 |
| 6,063,439 A | | 5/2000 | Semba et al. ............... 427/240 |

* cited by examiner

Primary Examiner—Donald W. Underwood
(74) Attorney, Agent, or Firm—U.P. Peter Eng; Wilson Sonsini Goodrich & Rosati (57) ABSTRACT

Systems and methods are described for wafer processing. A wafer processing apparatus includes: a first wafer transporter; a process station coupled to the first wafer transporter, the process station including: a first plurality of wafer processing stacks, each of the plurality of wafer processing stacks including a plurality of wafer processing modules, and a second wafer transporter coupled to the plurality of wafer processing modules, each of the plurality of wafer processing modules adjacent, and accessible by, the second wafer transporter; and a third wafer transporter coupled to the process station, wherein any of the plurality of wafer processing modules in any of the plurality of wafer processing stacks can be accessed by at least two adjacent wafer transporters from among the first, second and third wafer transporter. The systems and methods provide advantages from minimizing pre-process and/or post-process times, minimizing variation of the pre-process and/or post-process times and reducing robot over utilization.

8 Claims, 5 Drawing Sheets

APPARATUS FOR PROCESSING WAFERS

BACKGROUND OF THE INVENTION

1. Field of the Invention

The invention relates generally to the field of microelectronic fabrication. More particularly, the invention relates to wafer processing system layouts.

2. Discussion of the Related Art

In the process of manufacturing a semiconductor device, such as an integrated circuit, numerous steps for microfabrication must be performed to form a finished device. One of these steps is the formation of a photoresist layer on a surface of a wafer. The step of forming the photo-resist layer is typically performed in a wafer processing apparatus that can be termed a track system. In the track system, a series of processes are performed on the surface of the wafer in a series of modules in order to form the photo-resist layer.

A conventional track system includes three sections. The first section, which is an interface section, is used to transfer wafers from cassettes to the track system and, conversely, from the track system back to cassettes. The second section of the track is called the process section. The process section includes a number of process modules such as resist coating spin modules, bake modules, chill modules and resist developing spin modules. The third section, which is another interface section, is used to transfer the wafers from the track system to a lithographic exposure tool and, conversely, from the exposure tool back to the track. The wafers are transported between these sections. The wafers are delivered to, processed by, removed from, and transported among the process modules by wafer transport mechanisms.

The time a wafer resides in a process module is called wafer total process time. The total process time consists of the actual process time, which is determined by the process recipe, plus the module overhead time which is a finction at least in-part of the electromechanical design of the module. Pre-process time is defined as the time that a wafer waits in a module before the actual process time starts. Similarly, post process time is defined as the time a wafer waits in a module to be removed after the completion of the actual process time. The time between removing a wafer from a module and delivering it to the next module is called wafer transport time.

Wafers are first fed from one or more wafer cassettes to the track system through the cassette end station. In the process of forming a photoresist film layer, the surface of the wafer is first treated and moisture is removed with heat and/or chemically. The wafer is then cooled and conveyed to a coating unit where a photo-resist polymer is evenly distributed on the surface of the wafer. The photo-resist coated wafer is then sent to a heating unit and the photoresist polymer is converted into a stable film. At the completion of the heating step, the wafer is cooled and either conveyed to a cassette and stored as a treated wafer or, in most cases, transferred directly to the stepper, through a stepper interface. In the stepper, the stable film is exposed to a circuit pattern by a photolithographic technique. After exposure of the stable film, the wafer is transferred back to the track and is baked in a bake module to set the circuit pattern into the film The wafer is then cooled in a chill module and transferred to a spin develop module. In the spin develop module, a developing solution is applied onto the film to develop a portion of the film and then a rinse solution is applied to clean the surface of the wafer. Thereafter, the wafer is thermally treated in a bake module, cooled in a chill module and then returned to a cassette for storage and/or transport. The treating process and the sequence may vary depending upon the type of integrated circuit and the chemical compounds used in the processes. As a result, one or more of the sub-steps may be identified as a critical process which should be subject to minimum pre-process and/or post-process times. Further, a critical process should be subject to minimum variation of the pre-process and/or post-process times.

The maximum throughput of a track system is often limited by robot over utilization. Robot over utilization can be defined as a situation in which a lack of available robot resources causes an increase in post-process time. Conventionally, one or more of the following approaches has been utilized to address robot over utilization: (a) increasing robot speed; (b) adding more wafer handlers; and (c) providing robots with more than one dedicated wafer handling mechanism. Increasing robot speed increases the cost of the track system, reduces reliability and eventually reaches a design limit. Adding dedicated transfer arms to transport wafers among two adjacent and successive process modules constrains the system layout, increases the cost of the track system, and can not be used where modules are not adjacent and successive. Designing robots with more than one dedicated wafer handling mechanism adds to the complexity of the robot design, increases cost, and imposes additional restrictions on wafer handling.

Heretofore, the requirements of minimizing pre-process and/or post-process times, minimizing variation of the pre-process and/or post-process times and reducing robot over utilization referred to above have not been fully met. What is needed is a solution that simultaneously addresses all of these requirements.

SUMMARY OF THE INVENTION

A primary goal of the invention is to eliminate the need for dedicated transfer arms to avoid thermal cross-talk. Another primary goal of the invention is to minimize pre-process and/or post-process times. Another primary goal of the invention is to minimize variation of the pre-process and/or post-process times. Another primary goal of the invention is to reduce robot over utilization.

In accordance with these goals, there is a particular need for a wafer processing system layout where every wafer processing module in both a first process station and a second process station is accessible by (i) a respective process station robot and (ii) either a wafer cassette transfer robot or a stepper transfer robot. Also in accordance with these goals, there is a particular need for a wafer processing system layout where any wafer processing module in a wafer processing station can be accessed by at least two adjacent wafer transporters (e.g. robots). Also in accordance with these goals, there is a particular need for a wafer processing system layout where each of a first process station and a second process station are individually symmetrical with regard to wafer transporter access on both an X-axis and a Y-axis. Thus, it is rendered possible to simultaneously satisfy the above-discussed requirements of minimizing pre-process and/or post-process times, minimizing variation of the pre-process and/or post-process times and reducing robot over utilization, which, in the case of the prior art, are not simultaneously satisfied.

A first aspect of the invention is implemented in an embodiment that is based on a wafer processing apparatus, comprising: a first wafer transporter; a first process station coupled to said first wafer transporter, said first process station including: a first plurality of wafer processing stacks, each of said first plurality of wafer processing stacks including a first plurality of wafer processing modules, and a second wafer transporter coupled to said first plurality of wafer processing stacks, each of said first plurality of wafer processing modules adjacent, and accessible by, said second wafer transporter; a second process station coupled to said first wafer transporter, said second process station including: a second plurality of wafer processing stacks, each of said second plurality of wafer processing stacks including a second plurality of wafer processing modules, and a third wafer transporter coupled to said plurality of wafer processing stacks, each of said second plurality of wafer processing modules adjacent, and accessible by, said third wafer transporter; and a fourth wafer transporter coupled to both said first process station and said second process station, wherein each of said plurality of wafer processing modules in each of said plurality of wafer processing stacks is also accessible by either said first wafer transporter or said fourth wafer transporter. A second aspect of the invention is implemented in an embodiment that is based on a wafer processing apparatus, comprising: a first wafer transporter; a process station coupled to said first wafer transporter, said process station including: a plurality of wafer processing stacks, each of said plurality of wafer processing stacks including a plurality of wafer processing modules, and a second wafer transporter coupled to said plurality of wafer processing modules, each of said plurality of wafer processing modules adjacent, and accessible by, said second wafer transporter; and a third wafer transporter coupled to said process station, wherein any of said plurality of wafer processing modules in any of said plurality of wafer processing stacks can be accessed by at least two adjacent wafer transporters selected from the group consisting of said first wafer transporter, said second wafer transporter, and said third wafer transporter. A third aspect of the invention is implemented in an embodiment that is based on a wafer processing apparatus, comprising: a first wafer transporter; a first process station coupled to said first wafer transporter, said first process station including: a first plurality of wafer processing stacks, each of said first plurality of wafer processing stacks including a first plurality of wafer processing modules, and a second wafer transporter coupled to said first plurality of wafer processing stacks, each of said first plurality of wafer processing modules adjacent, and accessible by, said second wafer transporter; a second process station coupled to said first wafer transporter, said second process station including: a second plurality of wafer processing stacks, each of said second plurality of wafer processing stacks including a second plurality of wafer processing modules, and a third wafer transporter coupled to said plurality of wafer processing stacks, each of said second plurality of wafer processing modules adjacent, and accessible by, said third wafer transporter; and a fourth wafer transporter coupled to both said first process station and said second process station, wherein each of said first process station and said second process station are individually symmetrical with regard to wafer transporter access on both an X axis and a Y axis.

These, and other, goals and aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification, wherein like reference characters designate the same parts. It should be noted

DESCRIPTION OF PREFERRED EMBODIMENTS

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail.

The context of the invention includes the fabrication of semiconductor chips, circuit boards, and assembled components. The invention can also utilize data processing methods that transform process feedback so as to actuate interconnected discrete hardware elements; for example, to move or transfer wafers, or to affect the operation of the wafer processing modules.

The wafer processing apparatus is directed to addressing the above mentioned issues of minimizing pre-process and/or post-process times, minimizing variation of the pre-process and/or post-process times and reducing robot over utilization. Accordingly, a wafer processing apparatus can provide a timely and regularly periodic wafer handling system which improves both throughput and consistency in process result. The system layout provides cooperating or coupled stations such as cassette end storage stations, wafer processing stations, and stepper sections. The wafer processing apparatus includes within one or more of the processing stations a plurality of stacks, where each stack is formed from a plurality of processing modules. Various types of wafer processing modules, as well as configurations for arranging or organizing the modules may be provided by each of the stacks. In one embodiment, the apparatus of this invention provides for various process modules grouped in stacks that are arranged in a hexagonal pattern. Three wafer transporting units (e.g. robots) are coupled to the processing station to service the modules. The term coupled, as used herein, is defined as connected, although not necessarily directly, and not necessarily mechanically. The wafers are delivered to, removed from, and transported among the various process modules using one or more of the wafer transporting units.

The apparatus may include a first interface section on which at least one cassette station is placed and which contains a wafer transportation unit such as a robot that moves linearly in a direction parallel to the interface section and in a direction vertical to the floor plane. The wafer transportation unit of the first interface station may also rotate along an axis parallel to the vertical direction and may be capable of extending in a plane parallel to the floor. The apparatus also has at least one process station that includes various process modules arranged around a wafer transporting unit. The wafer transporting unit of the process station may be a robot that has the capability of moving vertically and rotating about an axis parallel to the vertical direction. The apparatus also has a second interface section with an input/output port and yet another wafer transportation unit. The wafer transporting unit of the second interface section may be a robot that moves linearly in the direction parallel to the interface section and in the direction vertical to the floor plane. The third wafer transporting unit may also rotate along an axis parallel to the vertical direction and is capable of extending in a plane parallel to the floor.

In one embodiment, the apparatus includes at least one process station around which a pivotable pick and place robot is provided for successive wafer delivery and removal from wafer process modules that are within, or accessible to, the process station. This embodiment includes a cassette end station (CES) on which cassettes for containing wafers may be located. This embodiment may also include a robot for transporting wafers bidirectionally between at least one cassette in the CES and at least one processing module in a stack of the process station. This embodiment may also include a stepper interface section (SI) with another robot for transferring wafers bidirectionally between at least one wafer process module in a stack of the process station and a stepper coupled to the SI.

The concept of the invention includes a thermal chamber as part of the track system. Preferably, the thermal chamber is enclosed and environmentally controlled, while being adapted to receive, monitor and control solvents, moisture, and other chemicals for processing wafers. The thermal chamber may also provide for extraction of the solvents, moisture and chemicals used for wafer processing. The pressure within the thermal chamber can be adjustable in order to facilitate the functions of the chamber. This thermal chamber can be one of the process modules.

This invention represents an improvement over the prior art in that it reduces issues arising from thermal cross-talk. Thermal cross-talk is an undesirable wafer fabrication condition arising from when the wafer and a gripper of the transportation unit are at substantially differing temperatures. The term cross-talk, as used herein, is defined as thermal contamination between a wafer and a robot gripper due to previous manipulation by the robot gripper of one or more wafers having a different temperature from a current wafer. For example, thermal cross-talk may occur when the wafer is at a hot temperature and a contact surface of the gripper is at a cool temperature, or vice-versa. In such instances, the thermal temperature difference between the contact surface of the gripper and the wafer may be sufficient to create thermal cross-talk. In certain wafer processing applications, and particularly in process stations where various baking and cooling modules are used, avoiding cross-talk may be crucial. The present invention allows for a central or main robot that has more functions and freedom than dedicated arms, but one which only handles wafers that are cold. Hot wafers are transferred by the CES robot or the SI robot.

This invention provides advantages over the known art in part by minimizing utilization of the main robot. Issues arise as a result of utilization of the main robot in instances where a) the robot has to transfer more than one wafer at the same time, b) the robot has insufficient speed to meet the wafer handling demand, and/or c) the robot has to load and unload hot and cold modules sequentially or in successive alternating fashion. The invention provides for delivery and removal of wafers between wafer processing modules while transporting the wafers among the various modules in a timely manner. The apparatus also significantly reduces or completely eliminates pre-process and/or post-process time in critical wafer processing modules. In addition, the apparatus eliminates or substantially reduces thermal cross-talk caused by wafer handling mechanisms, including thermal cross-talk resulting from the handling of a cold wafer with a hot object, or a hot wafer with a cold object. These features represent some of the advantages of this invention, and are attainable at least in-part by providing a wafer processing apparatus that reduces or minimizes the functions of the main robot.

Figure 1:
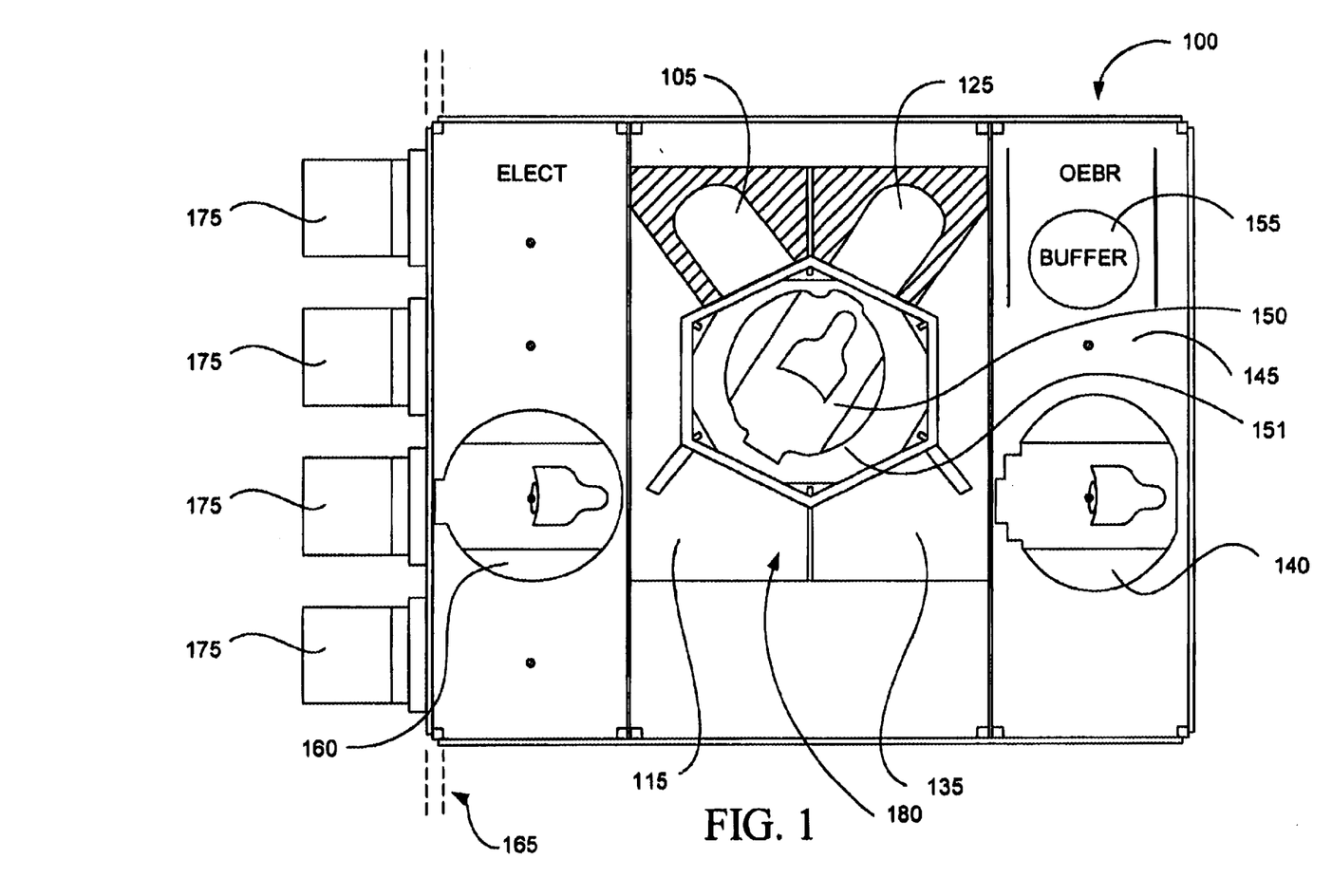
FIG. 1 illustrates a schematic plan view of a wafer process apparatus with one process station.

FIG. 1 illustrates an embodiment of a wafer processing apparatus 100 that contains multiple wafer processing modules arranged in a processing station 180, that is centrally located within the apparatus 100. The process station 180 provides a plurality of wafer processing stacks arranged around a main robot 150. The plurality of stacks includes a first stack 105, a second stack 115, a third stack 125, and a fourth stack 135. Each stack may include a plurality of wafer processing modules for various functions. While four stacks of wafer processing modules are shown in this particular embodiment grouped around the main robot 150 in a hexagonal pattern at a main robot station 151, (2 of the six facets are unused), more or fewer stacks may also be provided (and they may be grouped in other polygonal patterns). The main robot 150 is pivotable between all of the stacks to transfer wafers from any module in any stack to any other module in any other stack. A CES station 165 is adjacent to the process station 180 of the apparatus and contains a CES robot 160, as well as a plurality of cassette ends 175. Preferably, the CES robot 160 is pivotable or otherwise rotatable while being with provided linear freedom to traverse along the CES station 165. In this manner, the CES robot 160 may access wafer processing modules in the second stack 115 to transfers wafers between the processing station 180 and the plurality of cassettes in the CES station 165. A stepper interface 145 is adjacent to the process station 180 and includes an SI robot 140 and a buffer 155. The buffer 155 provides a buffer zone for wafers transferred to and from the stepper interface 145 when buffering is necessary during a particular fabrication step (routine). The SI robot 140 may access wafer processing modules contained in the fourth stack 135 to transfer wafers between the process station 180 and the stepper interface 145. Preferably, the SI robot 140 is pivotable or otherwise rotatable while being provided linear freedom to traverse along the stepper interface up to the buffer zone. In this manner, the SI robot 140 may access wafer processing modules in the stepper interface 145 and the fourth stack 135 to transfers wafers between the processing station 180, the stepper interface 145 or directly to the stepper. A stepper (not shown) can be coupled to the stepper interface 145.

Figure 2:
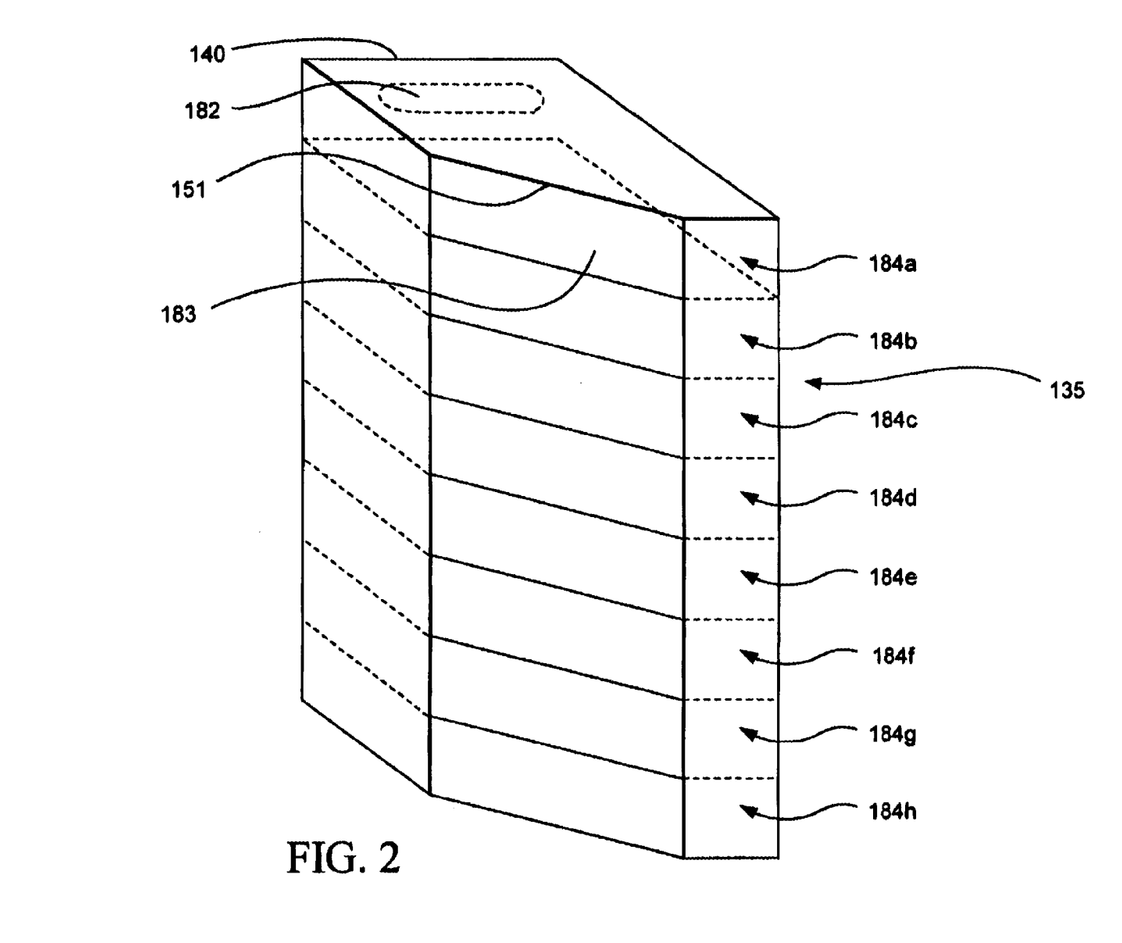
FIG. 2 is a schematic diagram of one embodiment of a stack assembly that can utilized with the wafer process apparatus of FIG. 1.

Referring now to FIG. 2, a schematic diagram of one embodiment of a stack assembly that can substituted in FIG. 1 is illustrated. As shown, a plurality of process modules 184(a)–184(h) can be arranged in a stack 135 configuration in any desired order. Any number of different types of process modules 184 can be included in a given stack 135 as desired or as the process mandates. The stack 135 of FIG. 2 is one that hosts several thermal modules 184(a)–184(h). As shown, any of these modules provide bi or multi directional access to the module 184 itself. Stack 135 is coupled with the SI station 145. A load part 182 allows the SI robot 140 to access the module 184(a) to load and unload a wafer. Access port 183 allows for the main robot 150 to load and unload the module 184(a).

Figure 3:
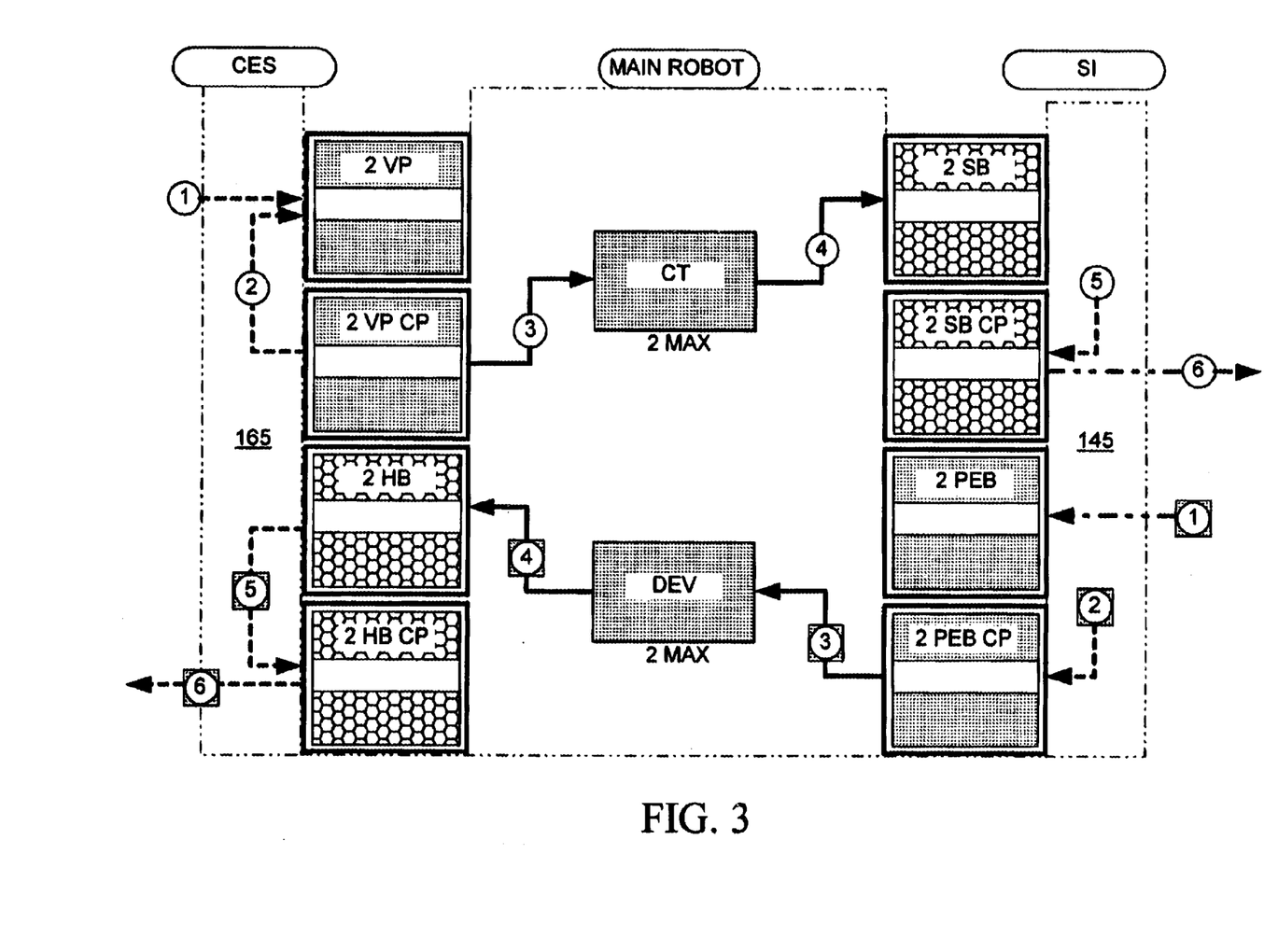
FIG. 3 illustrates a schematic view of a wafer handling load associated with the wafer processing apparatus shown in FIG. 1.

FIG. 3 illustrates a wafer flow chart for the embodiment shown in FIG. 1. A wafer may initially be transported from the CES station 165 by a CES robot to one or more vapor prime modules in a transfer operation labeled by the numeral one within a circle. The CES robot 160 transports the wafer to one or more vapor prime chill plates in a transfer labeled by the numeral two within a circle. The wafer may then subsequently be moved by the main robot 150 to one or more resist coating modules in a transfer labeled by the numeral three within a circle. From there, the wafer may be moved to one or more soft bake (SB) modules labored by the numeral four within a circle. The SI robot 140 then moves the wafer to one or more soft bake chill plate modules labeled by the numeral five within a circle. The wafer may then be moved through a stepper interface section 145 using the SI robot 140 to the stepper (not shown) or to the buffer zone in a transfer labeled by the numeral six within a circle.

FIG. 3 also shows the lithographically exposed wafer may be transported from the stepper interface section 145 to one or more post exposure bake modules by the SI robot 140 in a transfer labeled by the numeral one within a box. If the wafer is transfer to the buffer zone then the SI robot 140 moves the waver from the buffer 155 to one or more PEB modules. The wafer may then be transported by the SI robot 140 to one or more post exposure bake chill plate modules in a transfer labeled by the numeral two within a box. From there, the wafer may be transferred on to one or more developing modules in a transfer labeled by the numeral three within a box using the main robot 150. After the developing module the wafer may be moved to one or more hard bake (HB) modules and then to one or more hard bake chill plate modules in transfers labeled by the numeral six in a box.

From the arrangement described above, it can be noticed that the grippers of the main robot 150 will only be picking cold wafers. This eliminates thermal cross talk. The wafer is then transferred to one or more cassettes using the CES robot 160 labeled in box 6.

The processing apparatus 100 described in FIG. 1 is not limited to only one process station. It can be appreciated that the processing apparatus 100 can be expanded by adding additional process stations next to the station 180 of FIG. 1. Thus station 180 in FIG. 1 becomes the process station 280 of FIG. 4. This system with more than one process station is shown in FIG. 4.

Figure 4:
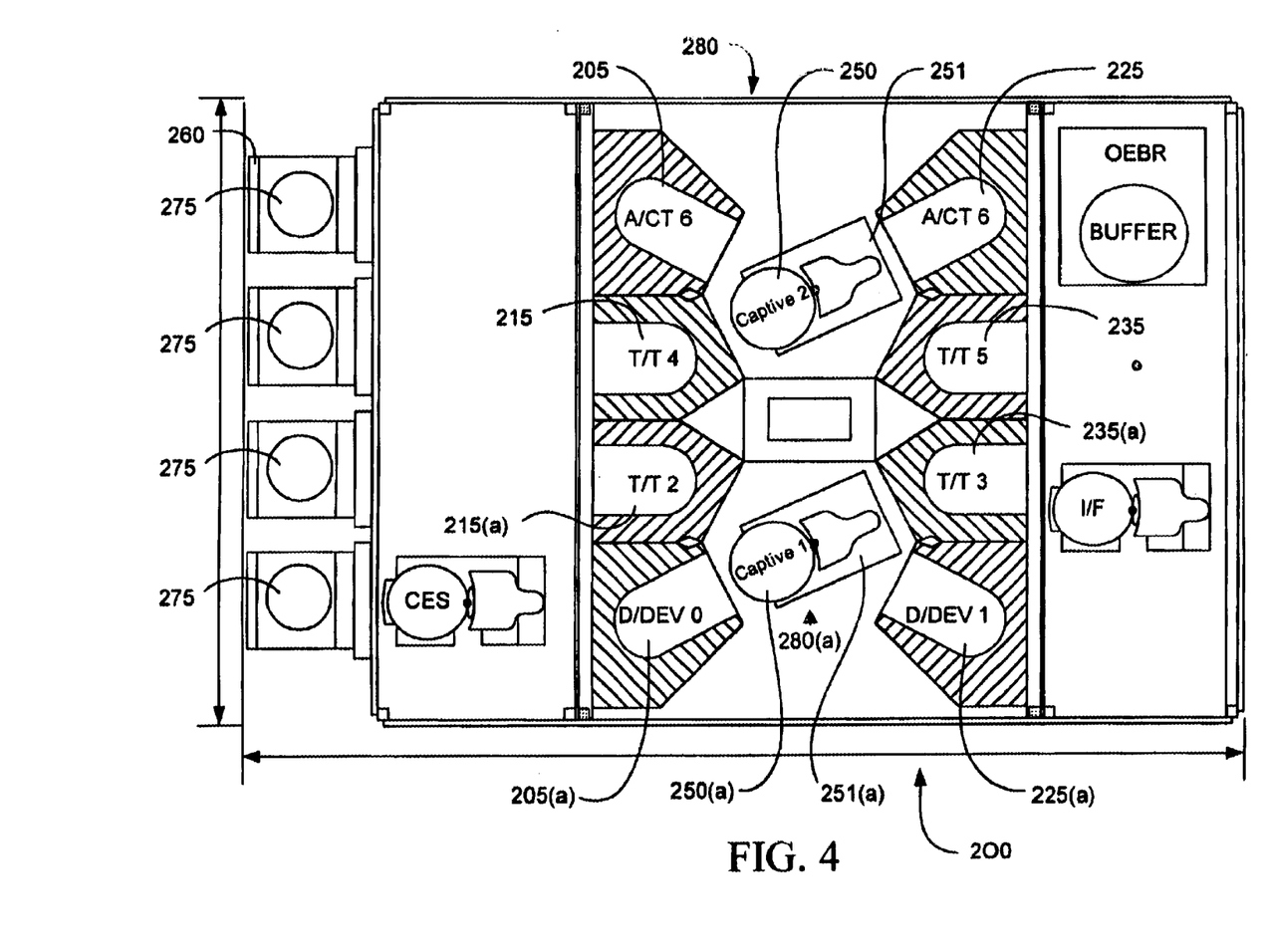
FIG. 4 illustrates schematic plan view of a wafer process apparatus having two process stations, representing an embodiment of the invention.
Figure 5:
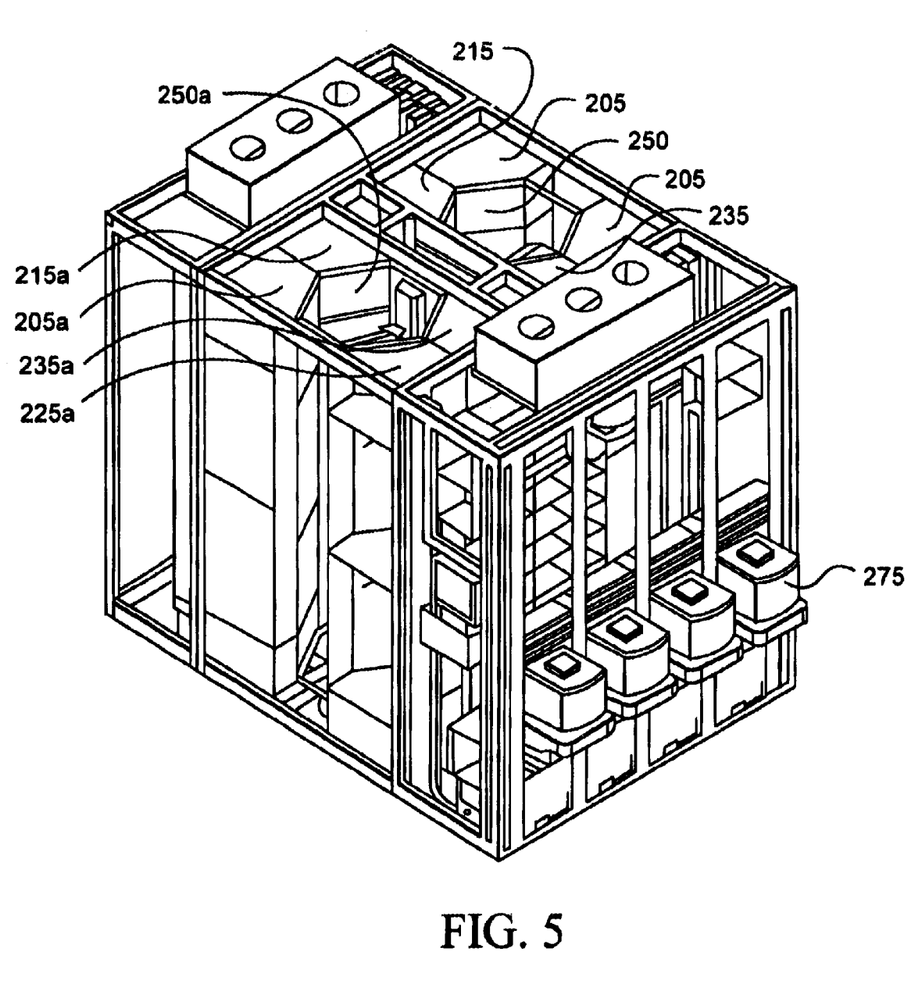
FIG. 5 illustrates a schematic perspective view of the wafer processing apparatus shown in FIG. 4.

FIG. 4 illustrates a processing apparatus 200 having a first process station 280 and a second process station 280a. The first process station 280 is equipped with a first main robot 250, and the second process station 280a is equipped with a second main robot 250a. The main robots 250 and 250a, at main robot stations 251 and 251(a) respectively, are pivotable pick and place robots with vertical movement capability. Each process station 280, 280a includes a first wafer processing stack 205, 205a, a second wafer processing stack 215, 215a, a third wafer processing stack 225, 225a, and a fourth wafer processing stack 235, 235a, where each wafer processing stack contains a plurality of wafer processing modules. All of the wafer processing modules of each processing station are accessible to the main robot of that processing station. A plurality of cassette ends 275 is aligned along one end of the apparatus 200 at a CES section 260.

While not being limited to any particular performance indicator or diagnostic identifier, preferred embodiments of the invention can be identified one at a time by testing for the presence of robot utilization. The test for the presence of robot over-utilization can be carried out without undue experimentation by the use of a simple and conventional robot idleness experiment. If a given robot is not idle, then post-process times are analyzed. Among the other ways in which to seek embodiments having the attribute of minimum pre-process and/or post process time guidance toward the next preferred embodiment can be based on the minimization of pre-process and/or post-process variation time.

Practical Applications of the Invention

A practical application of the invention that has value within the technological arts is semiconductor wafer processing. Further, the invention is useful in conjunction with nonlithographic wafer processing steps (such as are used for the purpose of making photovoltaic cells) or the like. There are virtually innumerable uses for the invention, all of which need not be detailed here.

Advantages of the Invention

A water processing system layout, representing an embodiment of the invention can be cost effective and advantageous for at least the following reasons. The invention helps reduce robot over utilization. The invention helps reduce variation in the pre-process and/or post-process times. The invention also helps to reduce the absolute pre-process and/or post-process times associated with a given sequence of processing modules.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, the individual components need not be formed in the disclosed shapes, or assembled in the disclosed configuration, but could be provided in virtually any shape, and assembled in virtually any configuration. Further, the individual components need not be fabricated from the disclosed materials, but could be fabricated from virtually any suitable materials. Further, although the wafer processing system described herein can be a physically separate module, it will be manifest that the wafer processing system may be integrated into the apparatus with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-finction limitations, unless such a limitation is explicitly recited in a given claim using the phrase "means-for." Expedient embodiments of the invention are differentiated by the appended subclaims.

What is claimed is:

1. A semiconductor wafer processing apparatus comprising:
   a first wafer process station including: a first main wafer transporter for handling semiconductor wafers within the first wafer process station, and a first plurality of wafer processing stacks containing process modules that are positioned in a polygonal configuration substantially around the first main wafer transporter;
   a second wafer process station disposed adjacent to the first wafer process station, and including: a second main wafer transporter for handling semiconductor wafers within the second wafer process station; and a second plurality of wafer processing stacks containing process modules that are positioned in a polygonal configuration substantially around the second main wafer transporter,
   a cassette end section for storing semiconductor wafers, and having a cassette wafer transporter that bidirectionally transports semiconductor wafers beyond the polygonal configuration of each respective wafer process station, and between at least one wafer processing stack in each wafer process station and the cassette end section; and
   a stepper interface section having a stepper wafer transporter that bidirectionally transports semiconductor wafers beyond the polygonal configuration of each respective wafer process station, and between at least one wafer processing stack in each wafer process station and the stepper interface section, wherein at least some of the process modules in each wafer process station are directly accessible by the cassette wafer transporter and the stepper wafer transporter.

2. The semiconductor wafer apparatus of claim 1, wherein each of the first and the second wafer process stations includes four (4) wafer processing stacks positioned substantially around the first and the second main wafer transporters respectively.

3. The semiconductor wafer apparatus of claim 2, wherein the polygonal configuration of each respective wafer process station provides a hexagonal layout with six accessible side portions, and wherein the four (4) wafer processing stacks occupy four of the six accessible side portions within the hexagonal layout.

4. A wafer processing system comprising:
   a pair of adjoining wafer process stations each including a process station robot arm that is centrally positioned among a respective plurality of wafer process stacks containing a series of process modules for processing semiconductor wafers, the wafer processing stacks being laid out in a substantially hexagonal configuration around each process station robot;
   a cassette end section communicatively coupled to the pair of adjoining wafer process stations, and including a cassette robot arm for bidirectionally transporting semiconductor wafers between at least one wafer process stack within each wafer process station and the cassette end section; and
   a stepper interface section communicatively coupled to the pair of adjoining wafer process stations, and including a stepper robot arm for bidirectionally transporting semiconductor wafers between at least one wafer process stack within each wafer process station and the stepper interface section.

5. A wafer processing apparatus comprising:
   a plurality of adjacently positioned wafer process stations which share in processing functions of the wafer processing apparatus, each wafer process station including a main wafer transporter and a plurality of wafer process stacks respectively which are positioned according to a predetermined polygonal layout that is equidistantly centered around the main wafer transporter in each wafer process station, and wherein each wafer process stack includes a plurality of process modules;
   a first interface section that includes a first interface wafer transporter for accessing at least one process module in each wafer process station; and
   a second interface section that includes a second interface wafer transporter for accessing at least one process module in each wafer process station;
   wherein the first interface section and the second interface section are each positioned on substantially opposite sides along each of the adjacent wafer process stations.

6. The wafer processing apparatus of claim 5, wherein the predetermined polygonal layout provides a hexagonal configuration with six defined side regions.

7. The wafer processing apparatus of claim 6, and wherein each wafer process station includes four (4) wafer process stacks which occupy four of the six defined side regions within the hexagonal configuration.

8. The wafer processing apparatus of claim 7, and wherein the remaining two of the six defined side regions within the hexagonal configuration provide access to and between other adjacently positioned wafer process stations.

* * * * *